US012563984B2

(12) United States Patent
Yamaguchi

(10) Patent No.: US 12,563,984 B2
(45) Date of Patent: Feb. 24, 2026

(54) SEMICONDUCTOR DEVICE MANUFACTURING METHOD AND SEMICONDUCTOR DEVICE MANUFACTURING SYSTEM

(71) Applicant: Tokyo Electron Limited, Tokyo (JP)

(72) Inventor: Tatsuya Yamaguchi, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 406 days.

(21) Appl. No.: 18/295,381

(22) Filed: Apr. 4, 2023

(65) Prior Publication Data

US 2023/0326739 A1     Oct. 12, 2023

(30) Foreign Application Priority Data

Apr. 12, 2022    (JP) ................................. 2022-065469

(51) Int. Cl.
*H01L 21/02* (2006.01)
*H01L 21/67* (2006.01)
*H10D 62/10* (2025.01)

(52) U.S. Cl.
CPC .. *H01L 21/02118* (2013.01); *H01L 21/67109* (2013.01); *H10D 62/115* (2025.01)

(58) Field of Classification Search
CPC ..................... H01L 21/02118; H01L 21/02271
See application file for complete search history.

(56) References Cited

U.S. PATENT DOCUMENTS

2018/0025917 A1*   1/2018   Yatsuda ............ H01L 21/31116
                                                                    438/694

FOREIGN PATENT DOCUMENTS

JP          2021048390 A   *  3/2021   ........ H01L 21/31144
JP          2021-174915 A       11/2021

OTHER PUBLICATIONS

JP2021048390, machine translation. (Year: 2021).*

* cited by examiner

*Primary Examiner* — Robert A Vetere
(74) *Attorney, Agent, or Firm* — Armstrong Teasdale LLP

(57)     ABSTRACT

A semiconductor device manufacturing method includes: forming an organic film composed of a polymer having a urea bond in a recess by supplying amine and isocyanate to a surface of a substrate having the recess; performing a predetermined process on the substrate on which the organic film is formed in the recess; and removing the organic film in the recess by heating the substrate that has been subjected to the predetermined process to depolymerize the organic film. The amine and the isocyanate have a terminal bifunctional linear chain structure having two functional groups at both ends of a linear chain. At least one of the amine or the isocyanate has side chains connected to the linear chain contained in the linear chain structure.

9 Claims, 20 Drawing Sheets

102    G1    G1    102
102    G1    ⟷ Control device

Figure 11:
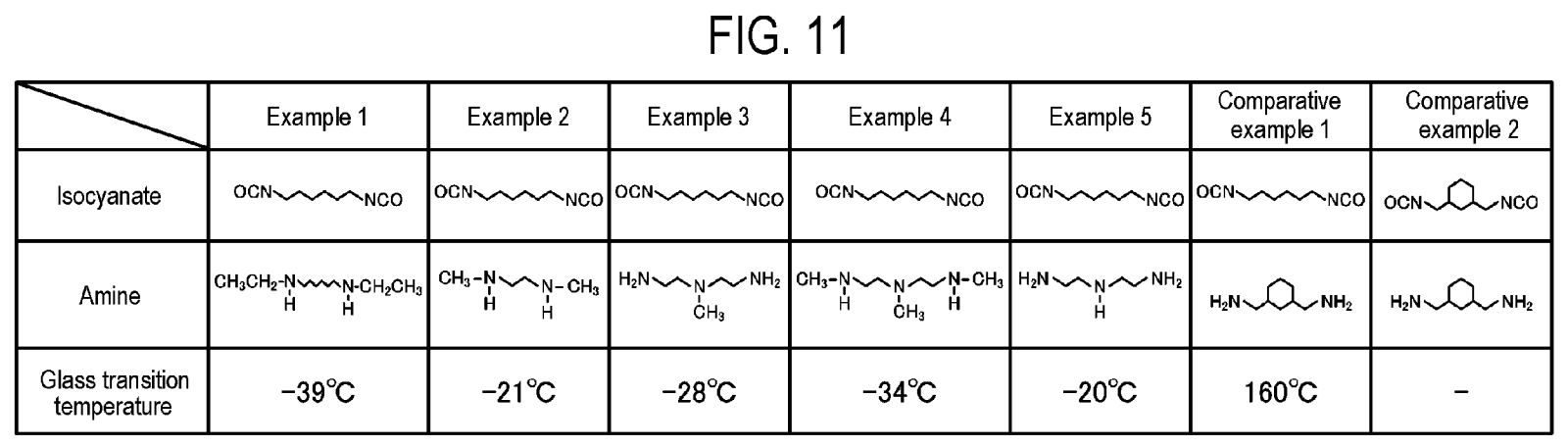

| | Example 1 | Example 2 | Example 3 | Example 4 | Example 5 | Comparative example 1 | Comparative example 2 |
|---|---|---|---|---|---|---|---|
| Isocyanate | OCN~~~NCO | OCN~~~NCO | OCN~~~NCO | OCN~~~NCO | OCN~~~NCO | OCN~~~NCO | OCN~~~NCO |
| Amine | $CH_3CH_2$-N~~~N-$CH_2CH_3$ | $CH_3$-N~~~N-$CH_3$ | $H_2N$~~~N~~~$NH_2$ | $CH_3$-N~~~N-$CH_3$ | $H_2N$~~~N~~~$NH_2$ | $H_2N$~~~$NH_2$ | $H_2N$~~~$NH_2$ |
| Glass transition temperature | −39°C | −21°C | −28°C | −34°C | −20°C | 160°C | − |

$CH_3CH_2 - N$ ⟋⟍⟋⟍⟋⟍ $N - CH_2CH_3$

|
H

|
H

Side chain ︷ Linear chain ︷ Side chain $CH_3 - N$ ⟋⟍ $N - CH_3$

|
H

|
H

Side chain ︷ Linear chain ︷ Side chain

H
|
X ⟋ N ⟋⟍⟍($\{$⟍⟋$\}_n$)⟍ N ⟋ X

|
H

Side chain ︷ Linear chain ︷ Side chain

FIG. 25

SEMICONDUCTOR DEVICE MANUFACTURING METHOD AND SEMICONDUCTOR DEVICE MANUFACTURING SYSTEM

CROSS-REFERENCE TO RELATED APPLICATION

This application is based upon and claims the benefit of priority from Japanese Patent Application No. 2022-065469, filed on Apr. 12, 2022, the entire contents of which are incorporated herein by reference.

TECHNICAL FIELD

The present disclosure relates to a semiconductor device manufacturing method and a semiconductor device manufacturing system.

BACKGROUND

In Patent Document 1, for example, there is known a technique in which an organic film is embedded in a recess formed on a substrate, a sealing film is formed on the recess embedded with the organic film, and the substrate is heated to thermally decompose the organic film through the sealing film, thereby forming an air gap in the recess.

PRIOR ART DOCUMENT

[Patent Document]
Patent Document 1: Japanese Laid-Open Patent Publication No. 2021-174915

SUMMARY

According to one embodiment of the present disclosure, a semiconductor device manufacturing method includes: forming an organic film composed of a polymer having a urea bond in a recess by supplying amine and isocyanate to a surface of a substrate having the recess; performing a predetermined process on the substrate on which the organic film is formed in the recess; and removing the organic film in the recess by heating the substrate that has been subjected to the predetermined process to depolymerize the organic film. The amine and the isocyanate have a terminal bifunctional linear chain structure having two functional groups at both ends of a linear chain. At least one of the amine or the isocyanate has side chains connected to the linear chain contained in the linear chain structure.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a system configuration diagram showing an example of a manufacturing system.

FIG. 11 is a diagram showing an example of a combination of isocyanate and amine as materials for an organic film.

FIG. 25 is a diagram showing an example of a molecular structure obtained by generalizing the amine structures of Examples 3 to 5.

DETAILED DESCRIPTION

Figure 2:
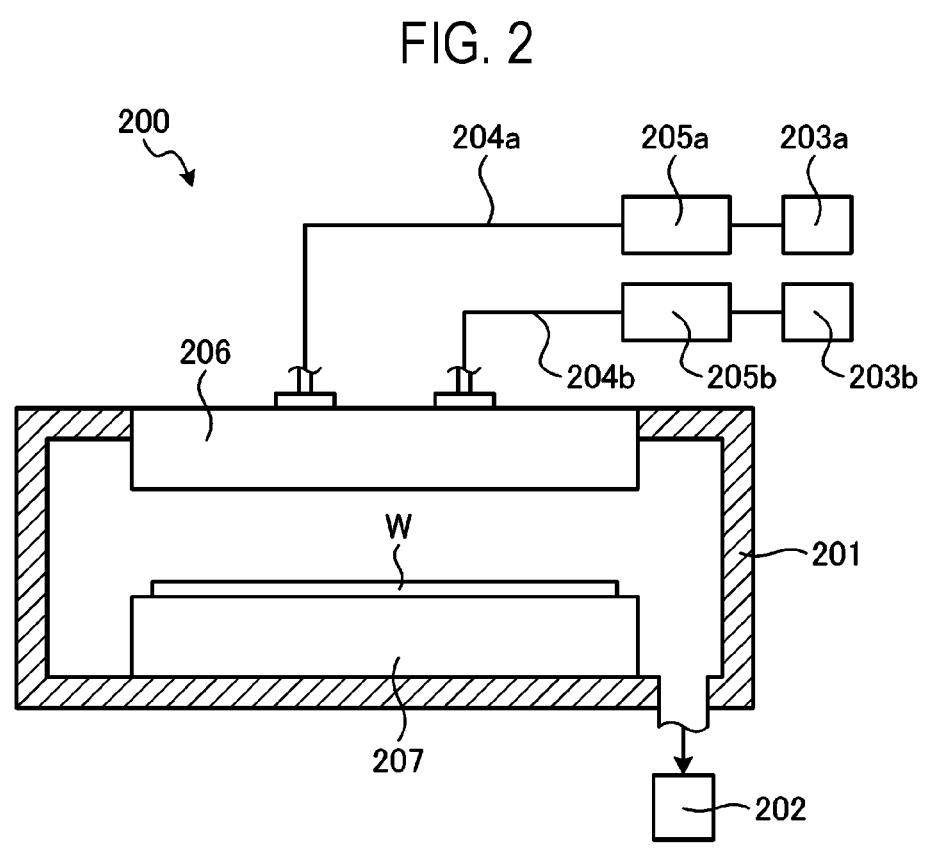
FIG. 2 is a schematic diagram showing an example of a film forming apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of a semiconductor device manufacturing method and a semiconductor device manufacturing system disclosed herein will be described below in detail with reference to the drawings. It should be noted that the semiconductor device manufacturing method and the semiconductor device manufacturing system disclosed herein are not limited to the following embodiments.

Incidentally, when an organic film is formed inside a recess by vapor deposition polymerization, the organic film is isotropically formed not only on the bottom of the recess but also on the side walls of the recess and the opening of the recess. Therefore, when the fluidity of the organic film is low, the opening of the recess may be closed before the organic film is formed on the entire interior of the recess, thereby generating a void and a seam in the organic film formed in the recess. If a void or a seam occurs in the organic film of the recess, the film formed in the subsequent process may enter the void or the seam. Therefore, when the organic film is removed in a later process to form a cavity in the recess, the shape of the cavity may be different from a desired shape. As a result, when the cavity is used as an air gap around a wiring, the magnitude of a parasitic capacitance formed by the air gap may differ from a desired magnitude.

Accordingly, the present disclosure provides a technique capable of forming a cavity having a desired shape in a recess.

[Configuration of Manufacturing System 10]

Figure 1:
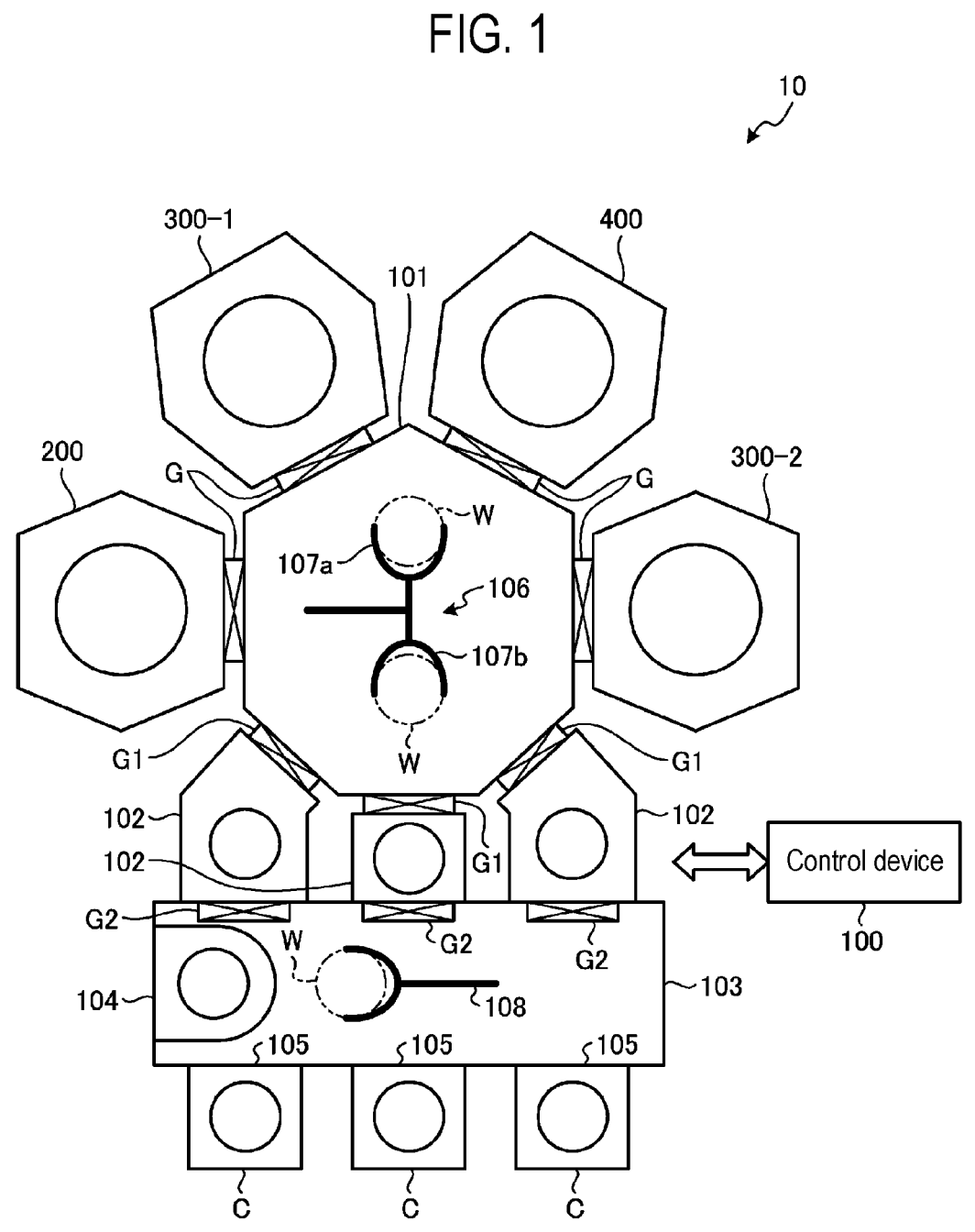

FIG. 1 is a system configuration diagram showing an example of a manufacturing system 10. The manufacturing system 10 includes a film forming apparatus 200, a heat treatment apparatus 300-1, a plasma processing apparatus 400, and a heat treatment apparatus 300-2. The manufacturing system 10 is a multi-chamber type vacuum processing system. The manufacturing system 10 uses the film forming apparatus 200, the heat treatment apparatus 300-1, the plasma processing apparatus 400, and the heat treatment apparatus 300-2 to form an air gap in a substrate W on which elements used in a semiconductor device are formed. The heat treatment apparatus 300-1 and the heat treatment apparatus 300-2 have the same configuration. In the following description, the heat treatment apparatus 300-1 and the heat treatment apparatus 300-2 are collectively referred to as heat treatment apparatus 300 when they are not distinguished from each other.

The film forming apparatus 200 forms a thermally decomposable organic film on a surface of the substrate W on which a recess is formed. In the present embodiment, the thermally decomposable organic film is a polymer having urea bonds generated by polymerization of multiple types of monomers. The heat treatment apparatus 300-1 removes the organic film formed around the recess of the substrate W by heating the substrate W to a first temperature. The plasma processing apparatus 400 uses microwave plasma to form a sealing film on the organic film formed in the recess of the substrate W. The heat treatment apparatus 300-2 heats the substrate W to a second temperature higher than the first temperature to thermally decompose the organic film under the sealing film, so that the organic film under the sealing film is desorbed through the sealing film. Thus, an air gap is formed between the sealing film and the recess.

The film forming apparatus 200, the heat treatment apparatus 300-1, the plasma processing apparatus 400, and the heat treatment apparatus 300-2 are connected via gate valves G to four side walls of a vacuum transfer chamber 101 having a heptagonal plan-view shape. Three other side walls of the vacuum transfer chamber 101 are connected to three load lock chambers 102 via gate valves G1. The three load lock chambers 102 are connected to an atmospheric transfer chamber 103 via gate valves G2.

The inside of the vacuum transfer chamber 101 is evacuated by a vacuum pump and kept at a predetermined degree of vacuum. A transfer mechanism 106 such as a robot arm or the like is provided in the vacuum transfer chamber 101. The transfer mechanism 106 transfers the substrate W between the film forming apparatus 200, the heat treatment apparatus 300-1, the plasma processing apparatus 400 and the heat treatment apparatus 300-2, and the respective load lock chambers 102. The transfer mechanism 106 has two independently movable arms 107a and 107b.

A plurality of ports 105 for attaching containers (e.g., FOUPs (Front-Opening Unified Pods)) C containing substrates W is provided on a side surface of the atmospheric transfer chamber 103. An alignment chamber 104 for aligning the substrate W is provided on the side wall of the atmospheric transfer chamber 103. In addition, a down flow of clean air is formed in the atmospheric transfer chamber 103.

A transfer mechanism 108 such as a robot arm or the like is provided in the atmospheric transfer chamber 103. The transfer mechanism 108 transfers the substrate W between each container C, each load lock chamber 102 and the alignment chamber 104.

A control device 100 includes a memory, a processor, and an input/output interface. The memory stores programs executed by the processor, recipes including conditions for each process, and the like. The processor executes the programs read from the memory, and controls each part of the manufacturing system 10 via the input/output interface based on recipes stored in the memory.

[Configuration of Film Forming Apparatus 200]

FIG. 2 is a schematic diagram showing an example of the film forming apparatus 200. The film forming apparatus 200 includes a container 201, an exhaust device 202, a shower head 206 and a mounting table 207. In the present embodiment, the film forming apparatus 200 is, for example, a CVD (Chemical Vapor Deposition) apparatus.

The exhaust device 202 exhausts a gas existing inside the container 201. The inside of the container 201 is controlled to a vacuum atmosphere having a predetermined pressure by the exhaust device 202.

Multiple types of raw material monomers are supplied to the container 201 via a shower head 206. In the present embodiment, the multiple types of raw material monomers are, for example, isocyanate and amine. A raw material supply source 203a containing isocyanate as a liquid is connected to the shower head 206 via a supply pipe 204a. A raw material supply source 203b containing amine as a liquid is connected to the shower head 206 via a supply pipe 204b.

The isocyanate liquid supplied from the raw material supply source 203a is vaporized by a vaporizer 205a installed in the supply pipe 204a. The isocyanate vapor vaporized by vaporizer 205a is introduced into the shower head 206, which is a gas discharge part, via the supply pipe 204a. Further, the amine liquid supplied from the raw material supply source 203b is vaporized by a vaporizer 205b installed in the supply pipe 204b. The amine vapor vaporized by the vaporizer 205b is introduced into the shower head 206 via the supply pipe 204b.

The shower head 206 is provided, for example, in the upper portion of the container 201, and has many discharge holes formed on the lower surface thereof. The shower head 206 discharges the isocyanate vapor and the amine vapor introduced through the supply pipes 204a and 204b into the container 201 from separate discharge holes in the form of a shower.

A mounting table 207 having a temperature adjustment mechanism (not shown) is provided in the container 201. A substrate W having a recess formed on the surface thereof is mounted on the mounting table 207. The mounting table 207 controls the temperature of the substrate W by the temperature adjustment mechanism so that the temperature of the substrate W becomes a temperature suitable for vapor deposition polymerization of the raw material monomers supplied from the raw material supply source 203a and the raw material supply source 203b. The temperature suitable for vapor deposition polymerization may be determined according to the types of raw material monomers. The temperature suitable for vapor deposition polymerization is, for example, a temperature within a range of 60 degrees C. to 100 degrees C.

Using such a film forming apparatus 200, an organic film is formed on the surface of the substrate W having a recess formed thereon by causing a vapor deposition polymerization reaction for two kinds of raw material monomers on the surface of the substrate W. When the two kinds of raw material monomers are isocyanate and amine, a polyurea polymer film is formed on the surface of the substrate W.

[Configuration of Heat Treatment Apparatus 300]

Figure 3:
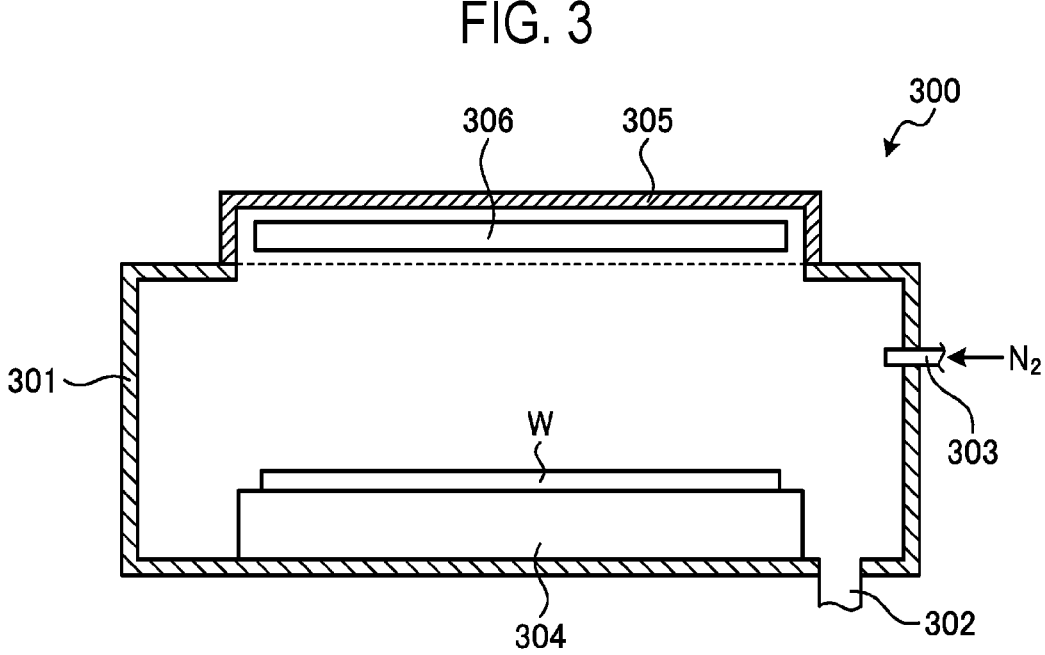
FIG. 3 is a schematic diagram showing an example of a heat treatment apparatus.

FIG. 3 is a schematic diagram showing an example of the heat treatment apparatus 300. The heat treatment apparatus 300 includes a container 301, an exhaust pipe 302, a supply pipe 303, a mounting table 304, a lamp house 305 and an infrared lamp 306.

The mounting table 304 on which the substrate W is mounted is provided in the container 301. The lamp house 305 is provided at a position facing the surface of the mounting table 304 on which the substrate W is mounted. The infrared lamp 306 is arranged in the lamp house 305.

An inert gas is supplied into the container 301 through the supply pipe 303. In the present embodiment, the inert gas is, for example, an $N_2$ gas.

By turning on the infrared lamp 306 in a state in which the substrate W is mounted on the mounting table 304 and the inert gas is supplied into the container 301 through the supply pipe 303, the substrate W having the organic film formed in the recess is heated to a first temperature. When the organic film formed in the recess of the substrate W reaches the first temperature, a portion of the surface of the organic film on the substrate W is thermally decomposed into two kinds of raw material monomers. As a result, the organic film formed around the recess of the substrate W is removed. When the organic film is made of polyurea, the organic film is partially depolymerized into isocyanate and amine, which are raw material monomers, by heating the organic film to the first temperature. In the present embodiment, when the organic film is made of polyurea, the first temperature is, for example, a temperature within a range of 230 degrees C. to 300 degrees C.

[Plasma Processing Apparatus 400]

Figure 4:
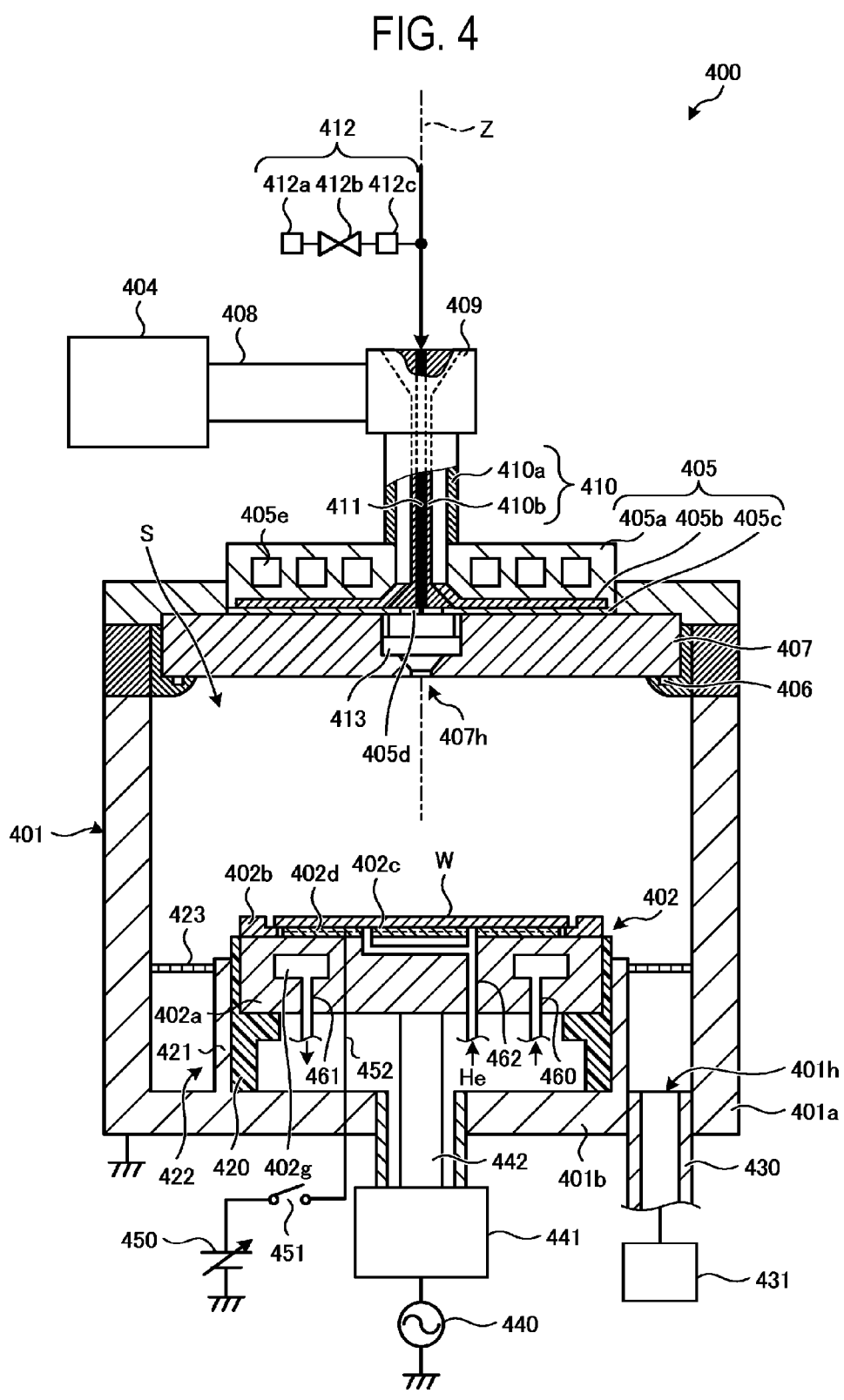
FIG. 4 is a schematic diagram showing an example of a plasma processing apparatus.

FIG. 4 is a schematic diagram showing an example of the plasma processing apparatus 400. The plasma processing apparatus 400 includes a processing container 401 and a microwave output device 404.

The processing container 401 is made of, for example, aluminum whose surface is anodized, and is formed in a substantially cylindrical shape. The processing container 401 provides a substantially cylindrical processing space S therein. The processing container 401 is grounded for a safety purpose. Further, the processing container 401 has a side wall 401a and a bottom portion 401b. A central axis of the side wall 401a is defined as a Z axis. The bottom portion 401b is provided on the lower end side of the side wall 401a. The bottom portion 401b is provided with an exhaust port 401h for gas exhaust. Further, the upper end of the side wall 401a is opened.

A dielectric window 407 is provided at the upper end of the side wall 401a, and the opening of the upper end of the side wall 401a is closed from above by the dielectric window 407. The lower surface of the dielectric window 407 faces the processing space S. An O-ring 406 is arranged between the dielectric window 407 and the upper end of the side wall 401a.

A stage 402 is provided in the processing container 401. The stage 402 is provided so as to face the dielectric window 407 in the Z-axis direction. The processing space S is a space between the stage 402 and the dielectric window 407. A substrate W is mounted on the stage 402.

The stage 402 includes a base 402a and an electrostatic chuck 402c. The base 402a is made of a conductive material such as aluminum or the like and formed in a substantially disk shape. The base 402a is arranged in the processing container 401 so that the central axis of the base 402a substantially coincides with the Z-axis.

The base 402a is supported by a cylindrical support part 420 made of a conductive material and extending along the Z-axis. A conductive cylindrical support part 421 is provided on the outer periphery of the cylindrical support part 420. The cylindrical support part 421 extends from the bottom portion 401b of the processing container 401 toward the dielectric window 407 along the outer periphery of the cylindrical support part 420. An annular exhaust passage 422 is formed between the cylindrical support part 421 and the side wall 401a.

An annular baffle plate 423 having a plurality of through holes formed in the thickness direction is provided above the exhaust passage 422. Below the baffle plate 423, the above-described exhaust port 401h is provided. The exhaust port 401h is connected via an exhaust pipe 430 to an exhaust device 431 including a vacuum pump such as a turbo-molecular pump or the like, an automatic pressure control valve, and the like. The exhaust device 431 can depressurize the processing space S to a predetermined degree of vacuum.

The base 402a also functions as a radio-frequency electrode. An RF power source 440 that outputs an RF signal for RF bias is electrically connected to the base 402a via a power supply rod 442 and a matching unit 441. The RF power source 440 supplies bias power of a predetermined frequency (e.g., 13.56 MHz) suitable for controlling the energy of ions drawn into the substrate W to the base 402a through the matching unit 441 and the power supply rod 442.

The matching unit 441 accommodates a matcher for matching between the impedance on the RF power source 440 side and the impedance on the load side such as the electrode, the plasma, and the processing container 401. The matcher contains a blocking capacitor for self-bias generation.

An electrostatic chuck 402c is provided on the upper surface of the base 402a. The electrostatic chuck 402c attracts and holds the substrate W by an electrostatic force.

The electrostatic chuck 402c has a substantially disk-shaped outer shape. A heater 402d is embedded in the electrostatic chuck 402c. A heater power source 450 is electrically connected to the heater 402d via a wiring 452 and a switch 451. The heater 402d heats the substrate W mounted on the electrostatic chuck 402c with the electric power supplied from the heater power source 450. An edge ring 402b is provided on the base 402a. The edge ring 402b is arranged to surround the substrate W and the electrostatic chuck 402c. The edge ring 402b is sometimes called a focus ring.

A flow path 402g is formed inside the base 402a. A refrigerant is supplied to the flow path 402g through a pipe 460 from a chiller unit (not shown). The refrigerant supplied into the flow path 402g is returned to the chiller unit via the pipe 461. The temperature of the base 402a is controlled by circulating the refrigerant having the temperature controlled by the chiller unit through the flow path 402g of the base 402a. The temperature of the substrate W on the electrostatic chuck 402c is controlled by the refrigerant flowing inside the base 402a and the heater 402d arranged inside the electrostatic chuck 402c.

Further, the stage 402 is provided with a pipe 462 for supplying a heat transfer gas such as a He gas or the like to between the electrostatic chuck 402c and the substrate W.

The microwave output device 404 outputs microwaves for exciting the processing gas supplied into the processing container 401. The microwave output device 404 generates microwaves with a frequency of, for example, 2.4 GHz.

The microwave output device 404 is connected to a mode converter 409 via a waveguide 408. The mode converter 409 converts the mode of the microwaves outputted from the microwave output device 404 and supplies the mode-converted microwaves to an antenna 405 via a coaxial waveguide 410.

The coaxial waveguide 410 includes an outer conductor 410a and an inner conductor 410b. The outer conductor 410a and the inner conductor 410b have a substantially cylindrical shape, and are arranged above the antenna 405 so that the central axes of the outer conductor 410a and the inner conductor 410b substantially coincide with the Z-axis.

The antenna 405 includes a cooling jacket 405a, a dielectric plate 405b, and a slot plate 405c. The slot plate 405c is made of a conductive metal and formed in a substantially disk shape. The slot plate 405c is provided on the upper surface of the dielectric window 407 so that the central axis of the slot plate 405c is aligned with the Z-axis. A plurality of slot holes is formed in the slot plate 405c. The slot holes are arranged in pairs around the central axis of the slot plate 405c.

The dielectric plate 405b is made of a dielectric material such as quartz or the like and formed in a substantially disk shape. The dielectric plate 405b is arranged on the slot plate 405c such that the central axis of the dielectric plate 405b substantially coincides with the Z-axis. The cooling jacket 405a is provided on the dielectric plate 405b.

The cooling jacket 405a is made of a material having conductivity on its surface, and has a flow path 405e formed therein. A refrigerant is supplied from a chiller unit (not shown) into the flow path 405e. The lower end of the outer conductor 410a is electrically connected to the upper surface of the cooling jacket 405a. Further, the lower end of the inner conductor 410b is electrically connected to the slot plate 405c through the openings formed in the central portions of the cooling jacket 405a and the dielectric plate 405b.

The microwaves propagated through the coaxial waveguide 410 propagate through the dielectric plate 405b and propagate to the dielectric window 407 through the plurality of slot holes of the slot plate 405c. The microwaves propagated through the dielectric window 407 are radiated into the processing space S from the bottom surface of the dielectric window 407.

A gas pipe 411 is provided inside the inner conductor 410b of the coaxial waveguide 410. A through hole 405d through which the gas pipe 411 can pass is formed at the central portion of the slot plate 405c. The gas pipe 411 extends through the inside of inner conductor 410b and is connected to a gas supply part 412.

The gas supply part 412 supplies a processing gas for forming a sealing film on the substrate W to the gas pipe 411. The gas supply part 412 includes a gas supply source 412a, a valve 412b, and a flow rate controller 412c. The gas supply source 412a is a supply source of processing gases for forming a sealing film. The processing gases include a nitrogen-containing gas, a silicon-containing gas, and a rare gas. In the present embodiment, the nitrogen-containing gas is, for example, an $NH_3$ gas or an $N_2$ gas, the silicon-containing gas is, for example, an $SiH_4$ gas, and the rare gas is, for example, a He gas or an Ar gas.

The valve 412b controls the supply and stopping the supply of the processing gases from the gas supply source 412a. The flow rate controller 412c is, for example, a mass flow controller or the like, and controls the flow rate of the processing gases from the gas supply source 412a.

An injector 413 is provided in the dielectric window 407. The injector 413 injects the processing gases supplied through the gas pipe 411 into the processing space S through a through hole 407h formed in the dielectric window 407. The processing gases injected into the processing space S are excited by the microwaves radiated into the processing space S through the dielectric window 407. As a result, the processing gases are turned into plasma in the processing space S, and a sealing film is formed on the substrate W by ions, radicals, and the like contained in the plasma.

[Semiconductor Device Manufacturing Method]

Figure 5:
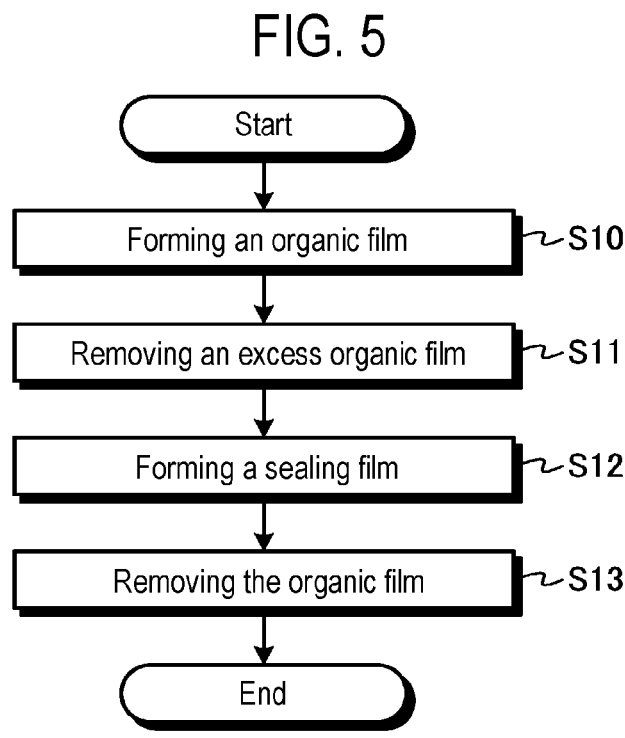
FIG. 5 is a flowchart illustrating an example of a semiconductor device manufacturing method.
Figure 6:
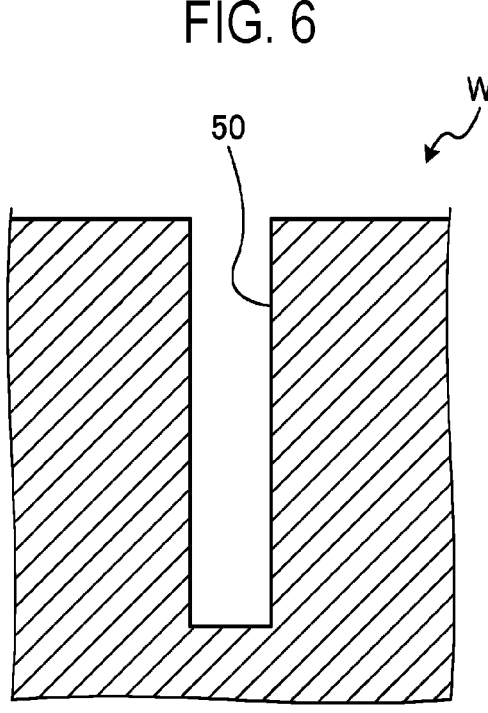
FIG. 6 is a schematic diagram showing an example of a semiconductor device manufacturing process.

FIG. 5 is a flowchart showing an example of a semiconductor device manufacturing method. The process illustrated in FIG. 5 is started by loading, for example, a substrate W having a recess 50 formed thereon as shown in FIG. 6 into the film forming apparatus 200 by the transfer mechanism 106. In the present embodiment, the aspect ratio of the recess 50 is, for example, 0.5 or more.

Figure 7:
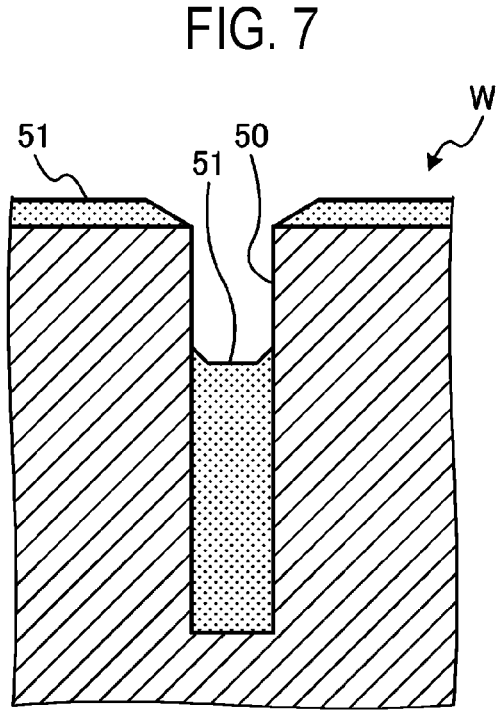
FIG. 7 is a schematic diagram showing an example of a semiconductor device manufacturing process.

First, an organic film is formed in the recess 50 by the film forming apparatus 200 (S10). Step S10 is an example of a film formation process. In step S10, a thermally decomposable organic film is formed on the substrate W in a state in which the substrate W is heated to a first temperature. The temperature of the substrate W in step S10 is higher than the glass transition temperature of the organic film and lower than 150 degrees C. Specifically, the temperature of the substrate W in step S10 is, for example, a temperature within a range of 60 degrees C. to 130 degrees C. As a result, for example, as shown in FIG. 7, an organic film 51 is formed in and around the recess 50 of the substrate W. In step S10, the organic film 51 is isotropically formed not only on the bottom of the recess 50 but also on the side wall of the recess 50 and the opening of the recess 50. Since the organic film 51 of the present embodiment has fluidity at the first temperature, it flows into the bottom of the recess 50. Thus, it is possible to suppress the occurrence of a void and a seam in the organic film 51 in the recess 50. Then, the substrate W is unloaded from the film forming apparatus 200 by the transfer mechanism 106 and loaded into the heat treatment apparatus 300-1.

Figure 8:
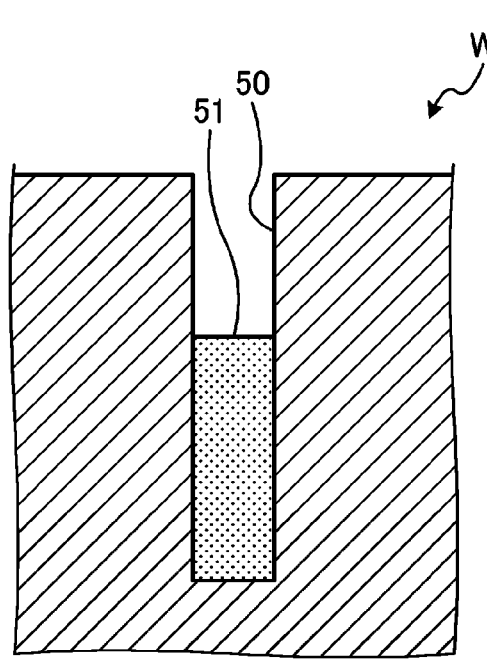
FIG. 8 is a schematic diagram showing an example of a semiconductor device manufacturing process.

Next, the substrate W is heated by the heat treatment apparatus 300-1, and the excess organic film 51 is removed (S11). In step S11, the substrate W is heated to a temperature within a range of, for example, 230 degrees C. to 300 degrees C. by the heat treatment apparatus 300-1. Thus, as shown in FIG. 8, the organic film 51 formed around the recess 50 is thermally decomposed and removed. Then, the substrate W is unloaded from the heat treatment apparatus 300-1 by the transfer mechanism 106 and loaded into the plasma processing apparatus 400.

Figure 9:
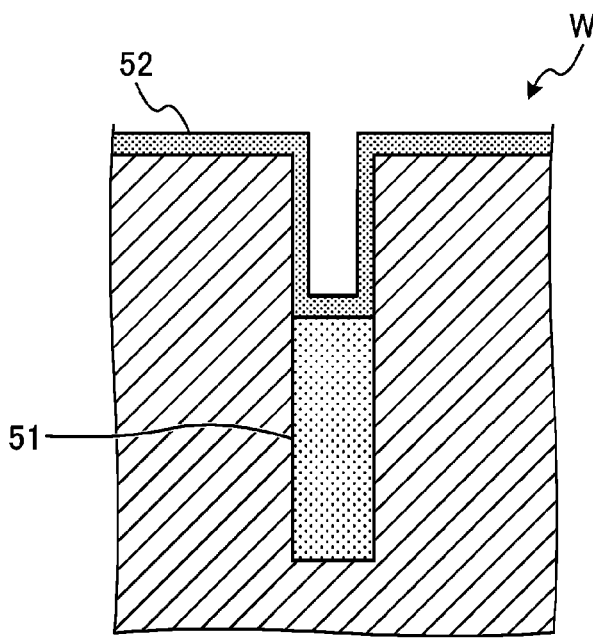
FIG. 9 is a schematic diagram showing an example of a semiconductor device manufacturing process.

Next, a sealing film 52 is formed on the substrate W by the plasma processing apparatus 400 (S12). Step S12 is an example of a processing process. In step S12, for example, as shown in FIG. 9, a sealing film 52 is formed on the substrate W using microwave plasma. The process of forming the sealing film 52 on the substrate W is an example of a predetermined process. Then, the substrate W is unloaded from the plasma processing apparatus 400 by the transfer mechanism 106 and loaded into the heat treatment apparatus 300-2.

Figure 10:
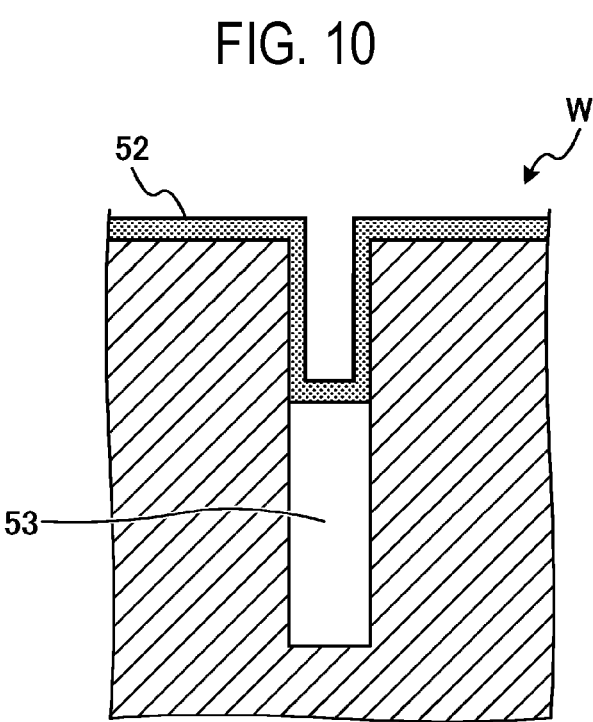
FIG. 10 is a schematic diagram showing an example of a semiconductor device manufacturing process.

Next, the organic film 51 in the recess 50 is removed by the heat treatment apparatus 300-2 (S13). Step S13 is an example of a removal process. In step S13, the substrate W is heated to a second temperature higher than the first temperature by the heat treatment apparatus 300-2. The second temperature is, for example, a temperature of 400 degrees C. or higher. As a result, the organic film 51 under the sealing film 52 is thermally decomposed and desorbed through the sealing film 52. Thus, for example, as shown in FIG. 10, an air gap 53 corresponding to the shape of the organic film 51 is formed under the sealing film 52 in the recess 50. Then, the substrate W is unloaded from the heat treatment apparatus 300-2 by the transfer mechanism 106, and the processing shown in the flowchart is completed.

Steps S10 and S11 may be repeated multiple times in the named order. As a result, the organic film 51 formed around the recess 50 can be removed, and the thickness of the organic film 51 in the recess 50 can be increased.

Example

FIG. 11 is a diagram showing an example of a combination of isocyanate and amine as materials for the organic film 51. In the combinations of Examples 1 to 5 and Comparative Example 1, isocyanate having the same molecular structure is used. Further, in the combination of Comparative Examples 1 and 2, amine having the same molecular structure is used.

Figure 12:
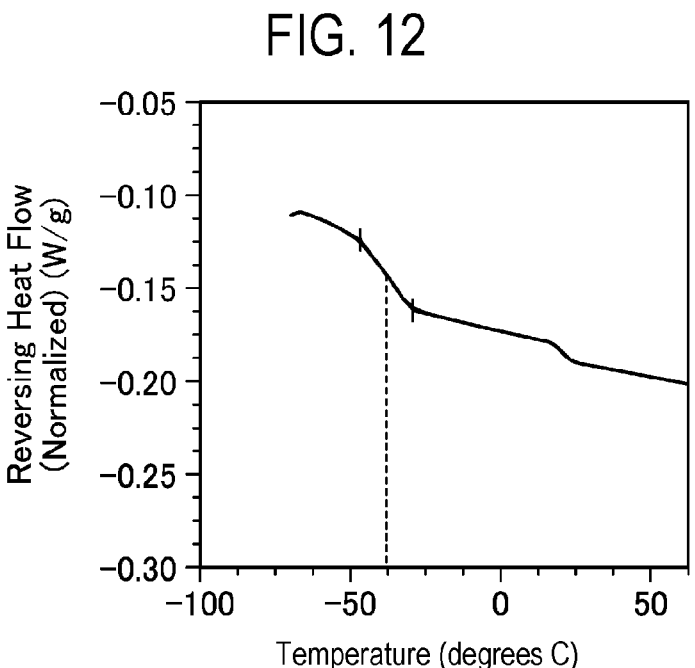
FIG. 12 is a diagram showing an example of MDSC measurement results for an organic film of Example 1.

FIG. 12 is a diagram showing an example of measurement results of temperature modulated differential scanning calorimetry (MDSC) on the organic film 51 formed by vapor deposition polymerization using a combination of isocyanate and amine in Example 1. As shown in FIG. 12, the glass transition temperature of the organic film 51 formed by the combination of Example 1 was about −39 degrees C.

Figure 13:
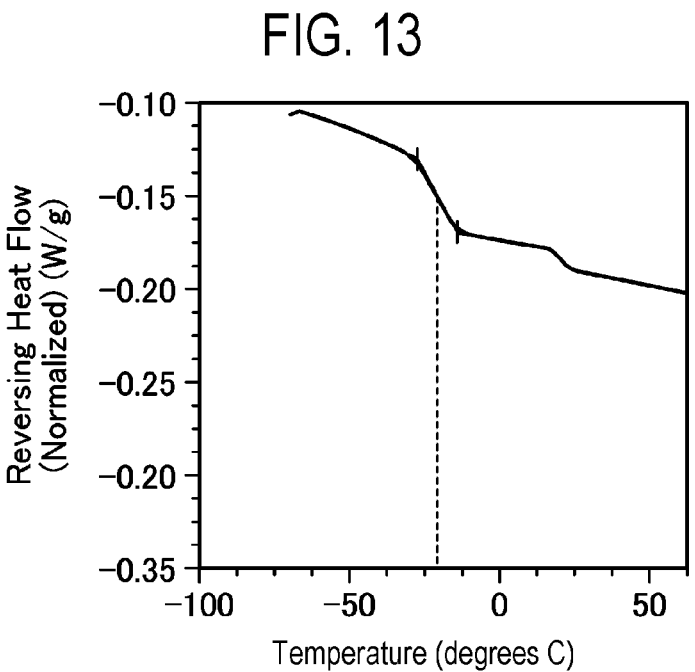
FIG. 13 is a diagram showing an example of MDSC measurement results for an organic film of Example 2.

FIG. 13 is a diagram showing an example of measurement results of temperature modulated differential scanning calorimetry (MDSC) on the organic film 51 formed by vapor deposition polymerization using a combination of isocyanate and amine in Example 2. As shown in FIG. 13, the glass transition temperature of the organic film 51 formed by the combination of Example 2 was about −21 degrees C.

Figure 14:
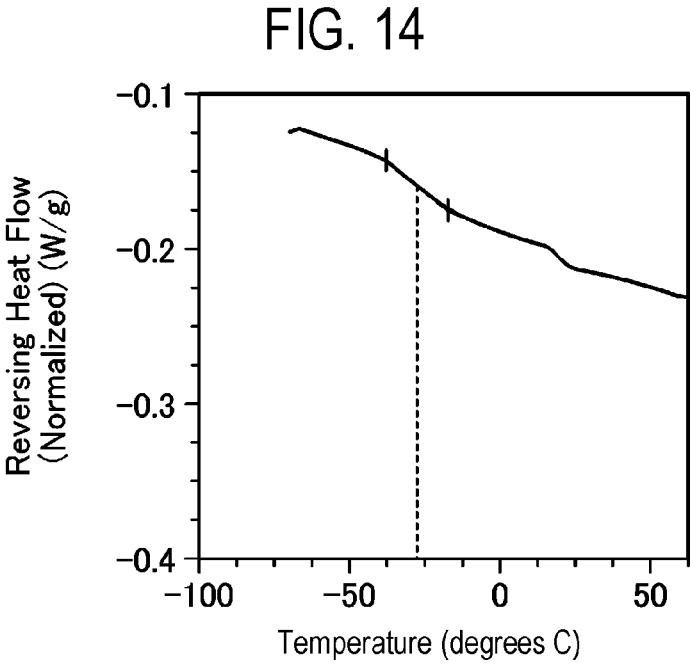
FIG. 14 is a diagram showing an example of MDSC measurement results for an organic film of Example 3.

FIG. 14 is a diagram showing an example of measurement results of temperature modulated differential scanning calorimetry (MDSC) on the organic film 51 formed by vapor deposition polymerization using a combination of isocyanate and amine in Example 3. As shown in FIG. 14, the glass transition temperature of the organic film 51 formed by the combination of Example 3 was about −28 degrees C.

Figure 15:
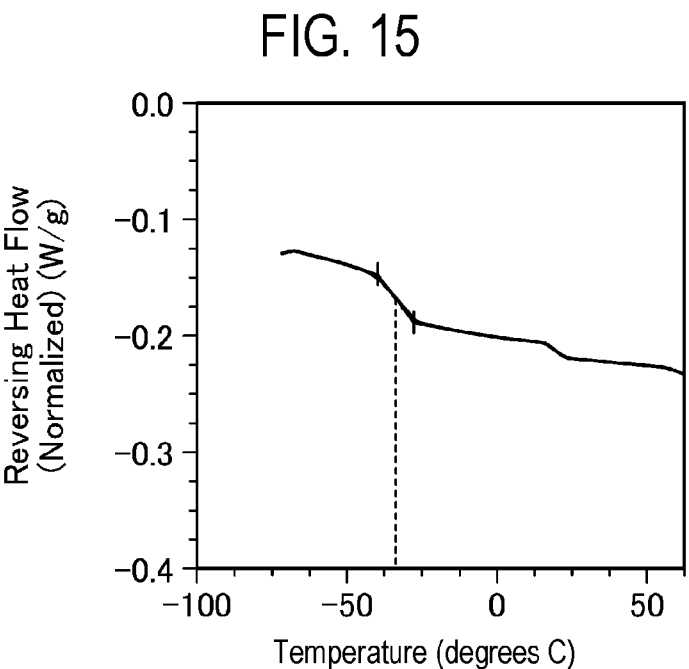
FIG. 15 is a diagram showing an example of MDSC measurement results for an organic film of Example 4.

FIG. 15 is a diagram showing an example of measurement results of temperature modulated differential scanning calorimetry (MDSC) on the organic film 51 formed by vapor deposition polymerization using a combination of isocyanate and amine in Example 4. As shown in FIG. 15, the glass transition temperature of the organic film 51 formed by the combination of Example 4 was about −34 degrees C.

Figure 16:
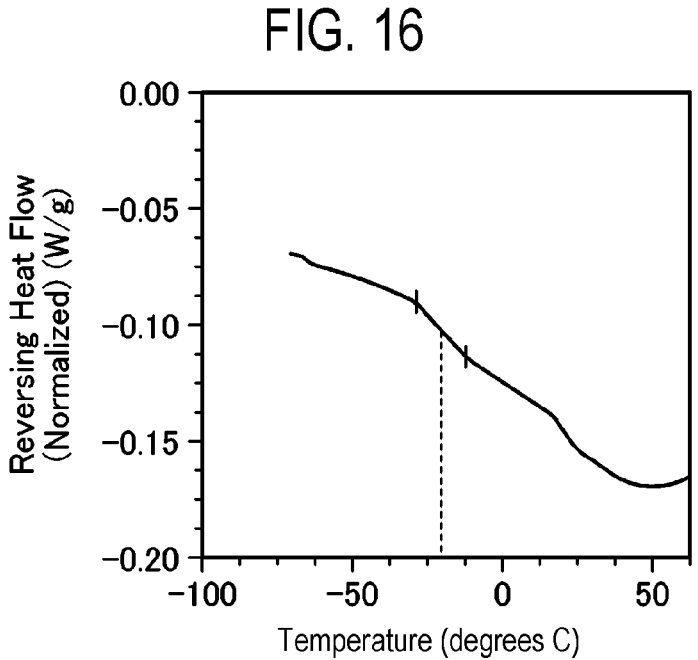
FIG. 16 is a diagram showing an example of MDSC measurement results for an organic film of Example 5.

FIG. 16 is a diagram showing an example of measurement results of temperature modulated differential scanning calorimetry (MDSC) on the organic film 51 formed by vapor deposition polymerization using a combination of isocyanate and amine in Example 5. As shown in FIG. 16, the glass transition temperature of the organic film 51 formed by the combination of Example 5 was about −20 degrees C.

Figure 17:
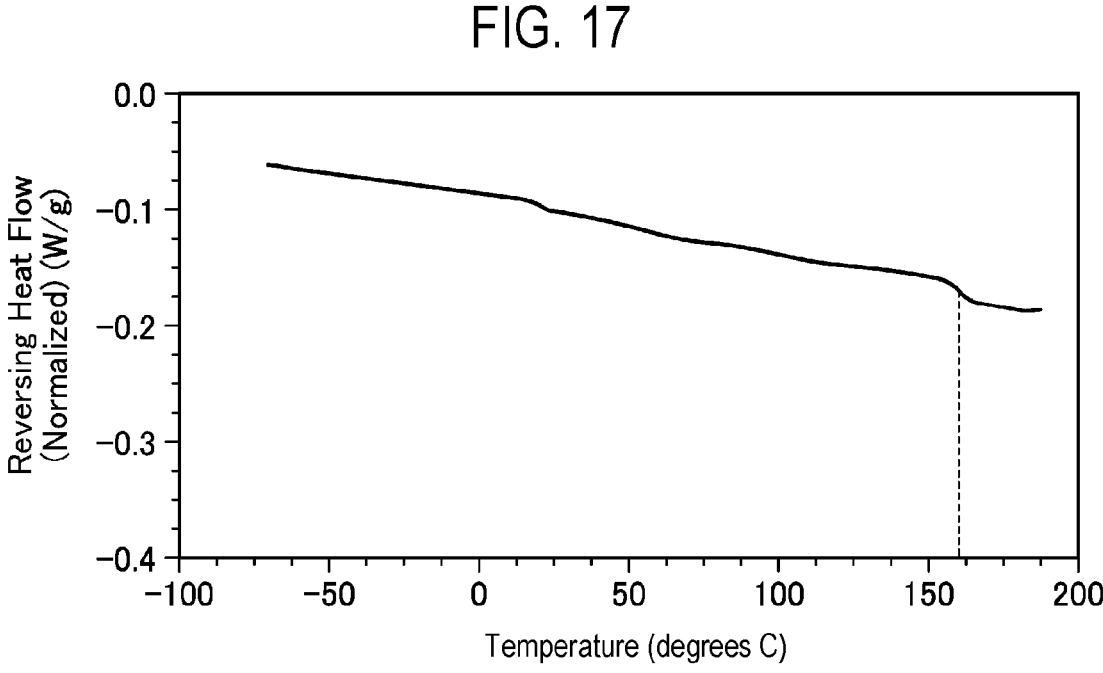
FIG. 17 is a diagram showing an example of MDSC measurement results for an organic film of Comparative Example 1.

FIG. 17 is a diagram showing an example of measurement results of temperature modulated differential scanning calorimetry (MDSC) on the organic film 51 formed by vapor deposition polymerization using a combination of isocyanate and amine in Comparative Example 1. As shown in FIG. 17, the glass transition temperature of the organic film 51 formed by the combination of Comparative Example 1 was about 160 degrees C.

Figure 18:
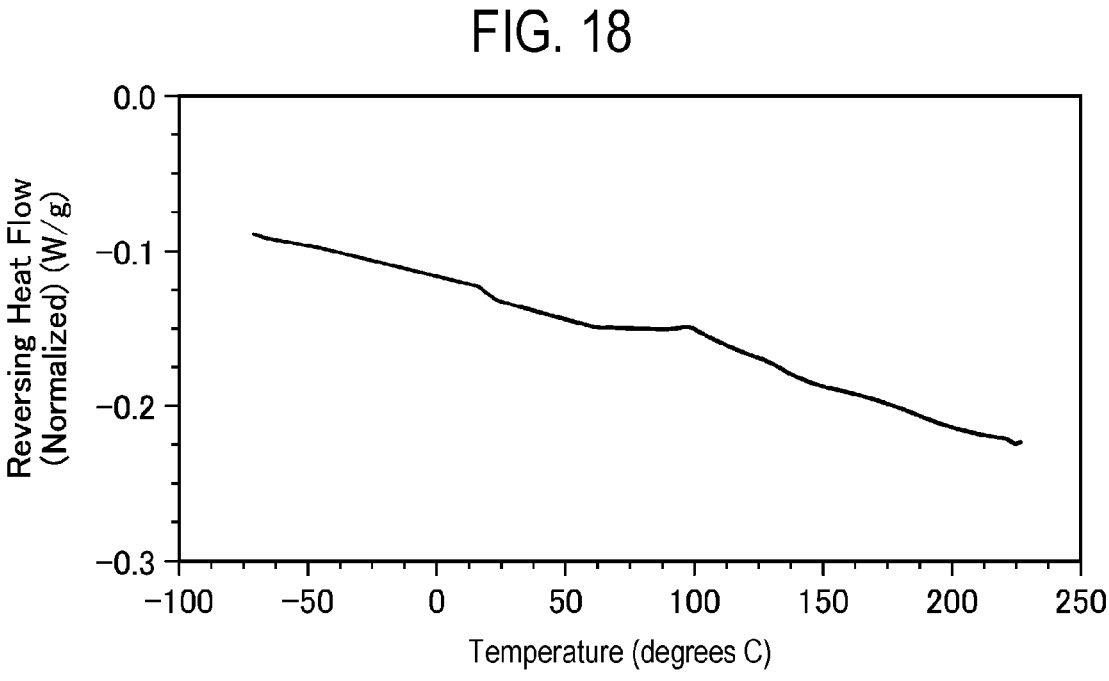
FIG. 18 is a diagram showing an example of MDSC measurement results for an organic film of Comparative Example 2.

FIG. 18 is a diagram showing an example of measurement results of temperature modulated differential scanning calorimetry (MDSC) on the organic film 51 formed by vapor deposition polymerization using a combination of isocyanate and amine in Comparative Example 2. As shown in FIG. 18, no glass transition temperature was detected in the organic film 51 formed by the combination of Comparative Example 2.

Figures 19, 20, 21:
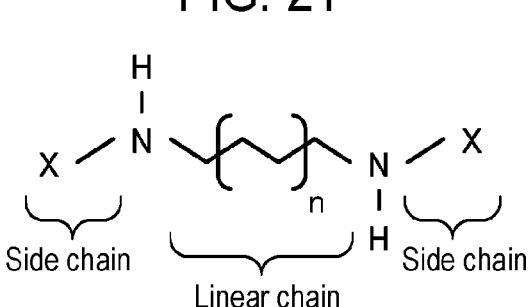
FIG. 19 is a diagram showing an example of a molecular structure of amine of Example 1.
FIG. 20 is a diagram showing an example of a molecular structure of amine of Example 2.
FIG. 21 is a diagram showing an example of a generalized molecular structure of amine of Examples 1 and 2.

The amine in the present embodiment has a terminal bifunctional linear chain structure having amino groups, which are functional groups, at both ends of a linear chain and having side chains connected to the linear chain contained in the linear chain structure. For example, as shown in FIG. 19, the amine in Example 1 includes a linear chain containing hydrocarbon, and side chains containing nitrogen atoms connected to both ends of the linear chain and alkyl groups connected to the nitrogen atoms. In the example of FIG. 19, the alkyl groups are ethyl groups. In the amine in Example 1, two functional groups at the ends of the linear chain are secondary amine. Further, in the example of FIG. 19, the side chains are connected to the linear chain through the nitrogen atoms contained in the secondary amine.

Further, for example, as shown in FIG. 20, the amine in Example 2 has a linear chain containing hydrocarbon, and side chains containing alkyl groups connected to the nitrogen atoms connected to both ends of the linear chain. In the example of FIG. 20, the alkyl groups are methyl groups. In the amine in Example 2, two functional groups at the ends of the linear chain are secondary amine.

Generalizing the structure of amine in Examples 1 and 2 results in, for example, a molecular structure as shown in FIG. 21. Specifically, for example, as shown in FIG. 21, the amine in Examples 1 and 2 has a linear chain containing hydrocarbon, and side chains containing nitrogen atoms attached to both ends of the linear chain and substituents X connected to the nitrogen atoms. In the example of FIG. 21, the substituents X are alkyl groups such as methyl groups or ethyl groups. Further, in the example of FIG. 21, the value of n is an integer of 0 to 3.

Figure 22:
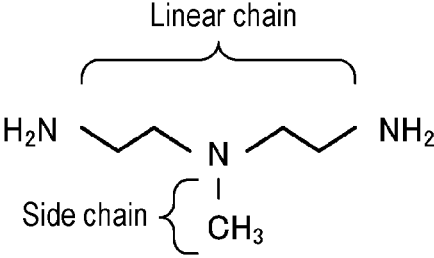
FIG. 22 is a diagram showing an example of a molecular structure of amine of Example 3.

Further, for example, as shown in FIG. 22, the amine in Example 3 has a linear chain containing hydrocarbon and a nitrogen atom, amino groups connected to both ends of the linear chain, and a side chain containing an alkyl groups connected to the nitrogen atom contained in the linear chain. In the example of FIG. 22, the alkyl groups are methyl groups.

Figure 23:
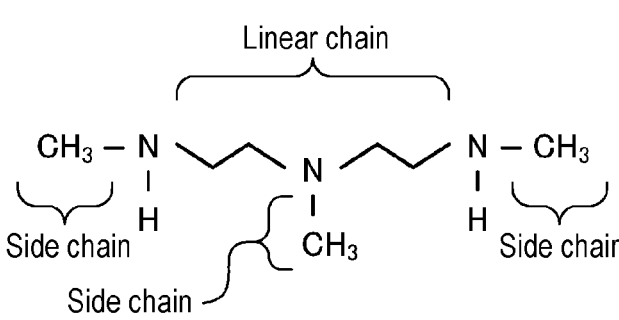
FIG. 23 is a diagram showing an example of a molecular structure of amine of Example 4.

Further, for example, as shown in FIG. 23, the amine in Example 4 has a linear chain containing hydrocarbon and a nitrogen atom, side chains containing nitrogen atoms connected to both ends of the linear chain and containing alkyl groups connected to the nitrogen atoms, and a side chain containing an alkyl group connected to the nitrogen atom contained in the linear chain. In the example of FIG. 23, the alkyl groups are methyl groups.

Figure 24:
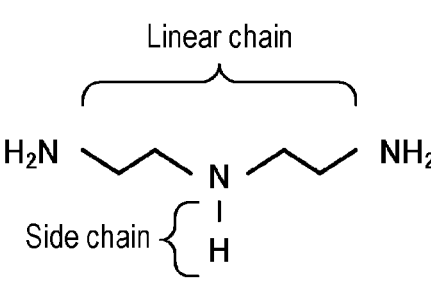
FIG. 24 is a diagram showing an example of a molecular structure of amine of Example 5.

Further, for example, as shown in FIG. 24, the amine in Example 5 has a linear chain containing hydrocarbon and nitrogen atom, amino groups connected to both ends of the linear chain, and a side chain containing hydrogen atom connected to the nitrogen atom contained in the linear chain.

Figure 25:
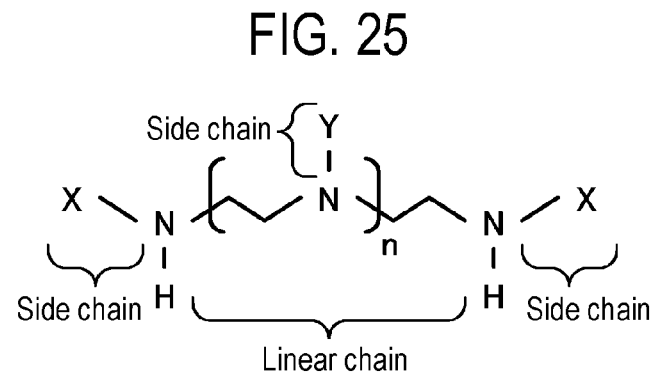

Generalizing the amine structure in Examples 3 to 5 results in, for example, a molecular structure as shown in FIG. 25. In the amine in Examples 3 to 5, the side chains are connected to atoms (e.g., nitrogen atom) included in the linear chain structure. Specifically, for example, as shown in FIG. 25, the amine in Examples 3 to 5 has a linear chain containing hydrocarbon and nitrogen atom, side chains containing substituents X connected to the nitrogen atoms connected to both ends of the linear chain, and a substituent Y connected to the nitrogen atom contained in the linear chain. In the example of FIG. 25, substituents X and Y are hydrogen atoms, or alkyl groups such as methyl groups or ethyl groups. Further, in the example of FIG. 25, the value of n is an integer of 1 to 3.

In the organic film formed by the combination of Comparative Example 2, no glass transition temperature was detected. Therefore, the organic film deposited by the combination of Comparative Example 2 is isotropically formed on the bottom and side walls of the recess without fluidity when deposited in the recess. As a result, when the organic film is formed in a recess having a high aspect ratio, the opening of the recess may be closed by the organic film before the organic film is formed in the entire interior of the recess. Thus, a void and a seam may be generated in the organic film.

On the other hand, a glass transition temperature was observed in the organic films formed by vapor deposition polymerization of amine and isocyanate in the combinations of Examples 1 to 5. Therefore, if the film forming temperature is higher than the glass transition temperature, the organic films formed by the combinations of Examples 1 to 5 have fluidity. In the present embodiment, the organic film is formed at, for example, 60 degrees C. to 130 degrees C., which is higher than the glass transition temperature of any of the organic films formed by the combinations of Examples 1 to 5. As a result, when forming the organic film in the recess having a high aspect ratio, the organic film having fluidity flows into the recess. Thus, it is possible to suppress the generation of a void and a seam in the organic film formed in the recess.

The glass transition temperature of the organic film formed by the combination in Comparative Example 1 was about 160 degrees C. Therefore, even in the combination of Comparative Example 1, it is considered that, by heating the substrate W to the temperature of 160 degrees C. or higher, the organic film having fluidity flows into the recess when the organic film is formed in the recess having a high aspect ratio. However, when the temperature of the substrate W is high, the adsorption of the organic film to the substrate W becomes difficult. Therefore, when the temperature of the substrate W is high, the deposition rate of the organic film is reduced, and the throughput is lowered.

Figure 26:
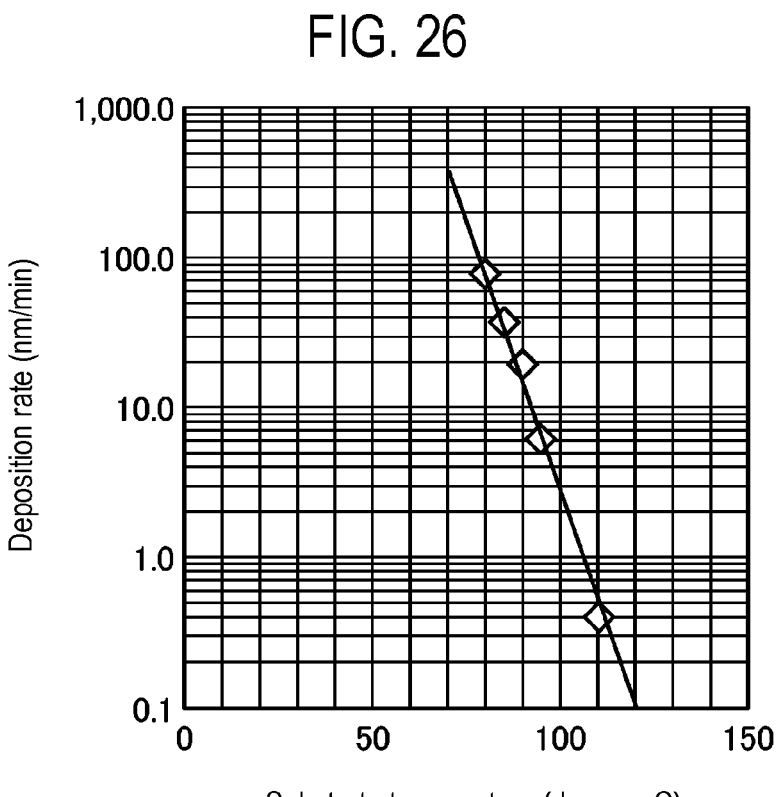
FIG. 26 is a diagram showing an example of a relationship between a substrate temperature and a deposition rate.

FIG. 26 is a diagram showing an example of a relationship between the temperature of the substrate W and the deposition rate. FIG. 26 shows experimental results of the deposition rate in the combination of Comparative Example 2. The tendency of the deposition rate with respect to the temperature remains the same even in the organic film formed by each combination of Examples 1 to 5 and Comparative Example 1. As shown in FIG. 26, the higher the temperature of the substrate W, the lower the deposition rate. When the temperature of the substrate W reaches 150 degrees C. or higher, almost no organic film is formed on the substrate W. Therefore, in the combination of Comparative Example 1, almost no organic film is formed on the substrate W in a state in which the substrate W is heated to 160 degrees C. or higher.

The amine in each combination of Examples 1 to 5 has a molecular structure having a linear chain and side chains. As a result, in the molecules having urea bonds formed by vapor deposition polymerization of amine and isocyanate, the packing between the molecules is suppressed. Therefore, it is possible to lower the glass transition temperature of the organic films formed by the combinations of Examples 1 to 5. The glass transition temperature of the organic films formed by the combinations of Examples 1 to 5 is sufficiently lower than 150 degrees C., for example, as shown in FIG. 11.

Further, in Comparative Example 1, the alicyclic skeleton itself, which has a cyclic structure, is less susceptible to structural changes. That is, the fluidity as polyurea is low. Presumably, this is because in Examples 1 to 5, the side chains of the linear-chain aliphatic structure, which are prone to structural changes, suppress the packing between molecules and lower the glass transition temperature, whereas in Comparative Example 1, the glass transition temperature is high regardless of the packing between molecules.

Therefore, in the combinations of Examples 1 to 5, by forming the film at a temperature (e.g., 60 degrees C. to 130 degrees C.) higher than the glass transition temperature and lower than 150 degrees C., the organic films can be formed on the substrate W in a state where the organic film has fluidity. This makes it possible to suppress generation of a void and a seam in the organic film formed in the recess. Thus, the shape of the cavity after removing the organic film can be made into a desired shape. Further, in the combinations of Examples 1 to 5, even when the temperature is lower than 150 degrees C., if the temperature is higher than the glass transition temperature, the organic film can be formed on the substrate W in a state in which the organic film has fluidity. Thus, an organic film can be formed on the substrate W at a high deposition rate. Accordingly, it is possible to improve the throughput.

Further, in Examples 1 to 5 described above, it was specified that, regarding the amine, a linear chain structure is a terminal bifunctional linear chain structure having amino groups, which are functional groups, at both ends of the linear chain and having side chains connected to the linear chain contained in the linear chain structure. However, the technique disclosed herein is not limited thereto. The terminal bifunctional linear chain structure having functional groups at both ends of the linear chain and having side chains connected to the linear chain contained in the linear chain structure may be any structure possessed by at least one of amine or isocyanate, which are materials for organic films.

Figure 27:
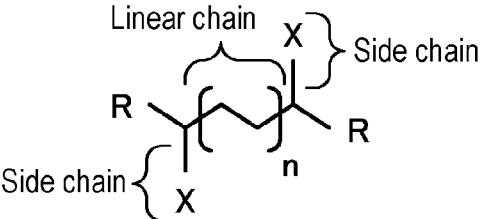
FIG. 27 is a diagram showing an example of a molecular structure obtained by generalizing the structures of amine and isocyanate.

As such a molecular structure, for example, a structure as shown in FIG. 27 may be considered. FIG. 27 is a diagram showing an example of a molecular structure obtained by generalizing the structures of amine and isocyanate. The molecular structure illustrated in FIG. 27 has a linear chain containing hydrocarbon, side chains containing substituents X connected to carbon atoms at both ends of the linear chain, and functional groups R connected to the carbon atoms at both ends of the linear chain. In the example of FIG. 27, the functional groups R are amino groups or isocyanate groups. The substituents X are alkyl groups such as methyl groups or ethyl groups. Further, in the example of FIG. 21, the value of n is an integer of 0 to 3.

In the amine having the structure shown in FIG. 27, the amino groups are connected to the carbon atoms that connect a linear chain and side chains. Further, in the isocyanate having the structure shown in FIG. 27, isocyanate groups are connected to the carbon atoms that connect a linear chain and side chains.

Figure 28:
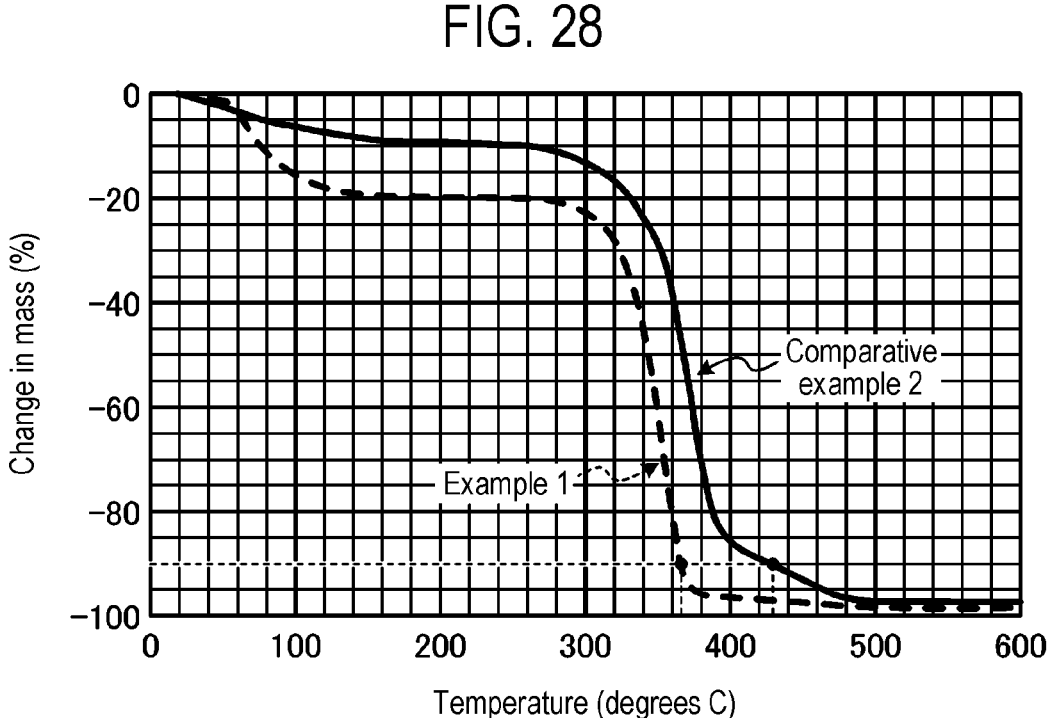
FIG. 28 is a diagram showing an example of change in mass of an organic film with respect to temperature.

Further, the glass transition temperature of the organic films formed by the combinations of Examples 1 to 5 is lower than that of Comparative Example 1 by $180°$ degrees C. or more. However, the temperature at which the organic films formed in the combinations of Examples 1 to 5 are removed by depolymerization is lower than that of Comparative Example 2 by several tens of degrees C. FIG. 28 is a diagram showing an example of the change in mass of the organic film with respect to the temperature.

For example, as shown in FIG. 28, the temperature at which the mass of the organic film is reduced by 90% is about 430 degrees C. for the organic film formed in the combination of Comparative Example 2. On the other hand, for example, as shown in FIG. 28, the temperature at which the mass of the organic film is reduced by 90% is about 370 degrees C. for the organic film formed in the combination of Example 1. As described above, the temperature at which the organic film formed in the combination of Example 1 is removed by depolymerization is lower than that of Comparative Example 2 by about 60 degrees C. A similar tendency is observed in the organic films formed in other combinations of Examples 2 to 5. That is, the organic films formed in the combinations of Examples 1 to 5 also have heat resistance comparable to that of the comparative examples.

The embodiment has been described above. As described above, the semiconductor device manufacturing method according to the above-described embodiment includes a film forming process, a processing process, and a removal process. In the film formation process, amine and isocyanate are supplied to the surface of the substrate W having the recess 50 to form the organic film 51 made of a polymer having a urea bond in the recess 50. In the processing process, a predetermined process is performed on the substrate W having the organic film 51 formed in the recess 50. In the removal process, the organic film 51 in the recess 50 is removed by heating the substrate W that has been subjected to the predetermined process to depolymerize the organic film 51. In addition, the amine and isocyanate have a terminal bifunctional linear chain structure having two functional groups at both ends of a linear chain, and at least one of the amine or isocyanate has side chains connected to the linear chain contained in the linear chain structure. Thus, the generation of a void and a seam in the organic film 51 formed in the recess 50 can be suppressed, and the shape of the cavity after removing the organic film 51 can be made into a desired shape.

In addition, in the amine of the above-described embodiment, the two functional groups at the ends of the linear chain may be secondary amine, and the side chains may be connected to the linear chain via nitrogen atoms contained in the secondary amine. By using the amine having such a molecular structure, it is possible to suppress the packing between molecules having urea bonds.

Further, in the amine or isocyanate of the above-described embodiment, the side chains are connected to atoms included in the linear chain. For example, the side chains are connected to the nitrogen atoms contained in the linear chain. By using the amine having such a molecular structure, it is possible to suppress the packing between molecules having urea bonds.

The amine of the above-described embodiment also has amino groups connected to carbon atoms that connect the linear chain and the side chains. By using the amine having such a molecular structure, it is possible to suppress the packing between molecules having urea bonds.

Further, the isocyanate of the above-described embodiment has isocyanate groups connected to carbon atoms that connect the linear chain and the side chains. By using the amine having such a molecular structure, it is possible to suppress the packing between molecules having urea bonds.

In the above-described embodiment, the film formation process is performed at a temperature higher than the glass transition temperature of the organic film 51 and lower than 150 degrees C. As a result, the organic film 51 can be formed on the substrate W in a state in which the organic film 51 has fluidity, and the generation of a void and a seam in the organic film 51 formed in the recess 50 can be suppressed.

Moreover, in the above-described embodiment, the aspect ratio of the recess 50 is 0.5 or more. Even if the recess 50 has such an aspect ratio, the generation of a void and a seam in the organic film 51 formed in the recess 50 can be suppressed by using amine and isocyanate having the molecular structure shown in the present embodiment.

Further, the semiconductor device manufacturing system according to the above-described embodiment includes the film forming apparatus 200, the heat treatment apparatus 300, and the plasma processing apparatus 400. The film forming apparatus 200 supplies amine and isocyanate to the surface of the substrate W having the recess 50 to form the organic film 51 made of a polymer having a urea bond in the recess 50. The plasma processing apparatus 400 performs a predetermined process on the substrate W having the organic film 51 formed in the recess 50. The heat treatment apparatus 300 removes the organic film 51 in the recess 50 by heating the substrate W that has been subjected to the predetermined process to depolymerize the organic film. In addition, the amine and isocyanate have a terminal bifunctional linear chain structure having two functional groups at both ends of a linear chain, and at least one of the amine or isocyanate has side chains connected to the linear chain contained in the linear chain structure. Thus, the generation of a void and a seam in the organic film 51 formed in the recess 50 can be suppressed, and the shape of the cavity after removing the organic film 51 can be made into a desired shape.

[Others]

The technique disclosed in the subject application is not limited to the above-described embodiment, and various modifications may be made within the scope of the gist thereof.

For example, in the above-described embodiment, the organic film 51 is formed in the recess 50 of the substrate W, the sealing film 52 is formed on the organic film 51, and the substrate W is heated to remove the organic film 51, thereby forming an air gap 53 under the sealing film 52. However, the disclosed technique is not limited thereto. As another example, the organic film 51 may be used to form a deep hole.

Figure 29:
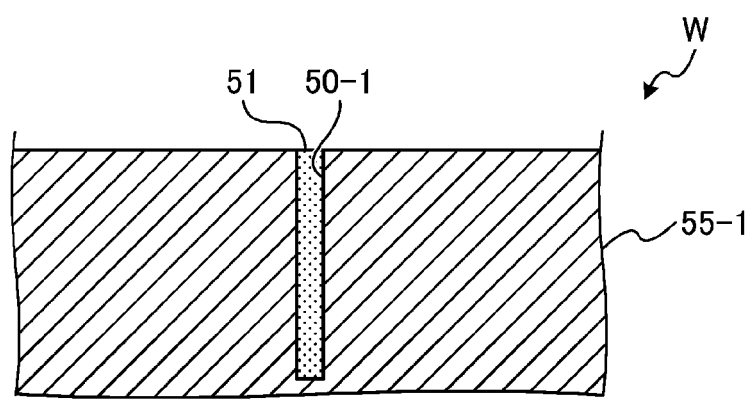
FIG. 29 is a schematic diagram showing another example of the semiconductor device manufacturing process.
Figure 30:
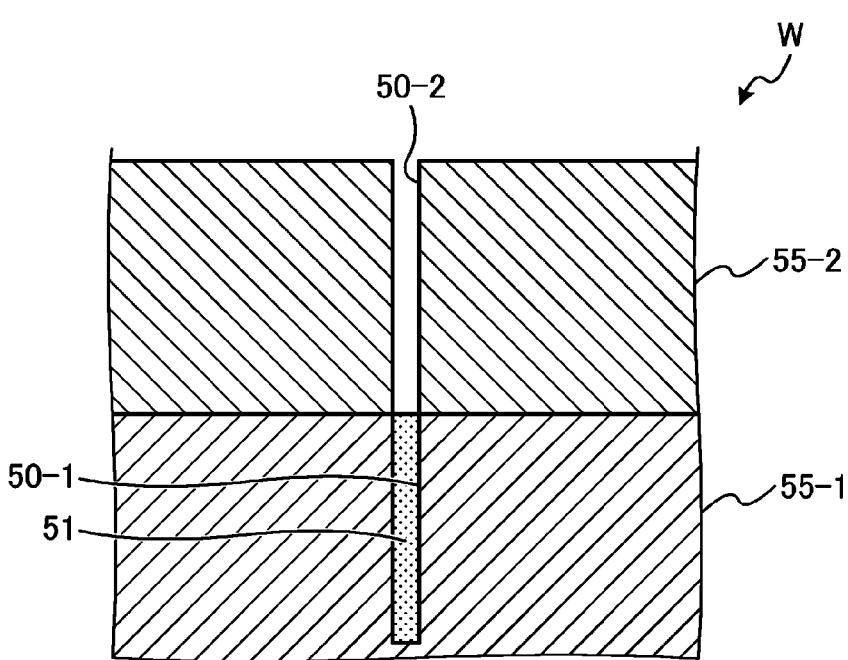
FIG. 30 is a schematic diagram showing another example of the semiconductor device manufacturing process.
Figure 31:
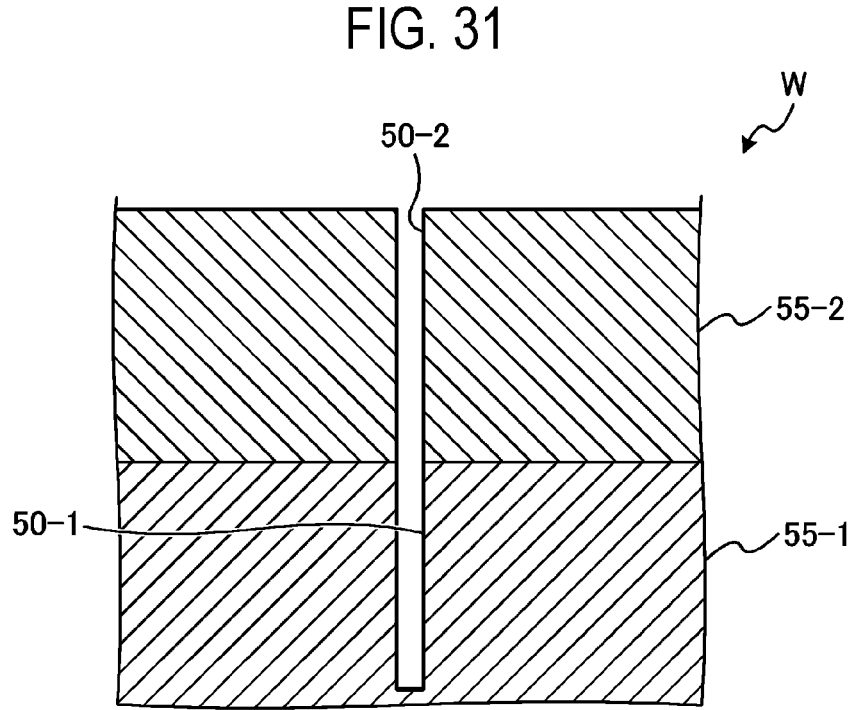
FIG. 31 is a schematic diagram showing another example of the semiconductor device manufacturing process.

For example, as shown in FIG. 29, a recess 50-1 is formed in an etching target film 55-1 by etching, and an organic film 51 is embedded in the recess 50-1. Then, for example, as shown in FIG. 30, an etching target film 55-2 is further formed on the film 55-1, and a recess 50-2 is formed in the film 55-2 by etching. At this time, the organic film 51 in the recess 50-1 is exposed at the bottom of the recess 50-2. Thereafter, by heating the substrate W to the second temperature, the organic film 51 in the recess 50-1 is depolymerized to remove the organic film 51 through the recess 50-2. Thus, for example, as shown in FIG. 31, it is possible to form a recess having a large aspect ratio. The process of further forming the etching target film 55-2 on the film 55-1 and forming the recess 50-2 in the film 55-2 by etching is an example of a predetermined process.

According to the present disclosure in some embodiments, it is possible to form a cavity having a desired shape in a recess.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device manufacturing method comprising:
   forming an organic film composed of a polymer having a urea bond in a recess by supplying amine and isocyanate to a surface of a substrate having the recess;

performing a predetermined process on the substrate on which the organic film is formed in the recess; and
   removing the organic film in the recess by heating the substrate that has been subjected to the predetermined process to depolymerize the organic film,
   wherein the amine and the isocyanate have a terminal bifunctional linear chain structure having two functional groups at both ends of a linear chain, and
   wherein at least one of the amine or the isocyanate has side chains connected to the linear chain contained in the linear chain structure.

2. The semiconductor device manufacturing method of claim 1, wherein in the amine, the two functional groups at both ends of the linear chain are secondary amine, and
   wherein the side chains are connected to the linear chain via nitrogen atoms contained in the secondary amine.

3. The semiconductor device manufacturing method of claim 2, wherein the side chains are connected to atoms contained in the linear chain structure.

4. The semiconductor device manufacturing method of claim 3, wherein the side chains are connected to nitrogen atoms contained in the linear chain structure.

5. The semiconductor device manufacturing method of claim 1, wherein the side chains are connected to atoms contained in the linear chain structure.

6. The semiconductor device manufacturing method of claim 1, wherein the amine has amino groups connected to carbon atoms that connect the linear chain and the side chains.

7. The semiconductor device manufacturing method of claim 1, wherein the isocyanate has isocyanate groups connected to carbon atoms that connect the linear chain and the side chains.

8. The semiconductor device manufacturing method of claim 1, wherein the forming the organic film is performed at a temperature higher than a glass transition temperature of the organic film and lower than 150 degrees C.

9. The semiconductor device manufacturing method of claim 1, wherein an aspect ratio of the recess is 0.5 or more.

* * * * *